(12) United States Patent  (10) Patent No.: US 7,440,792 B2
Eggers  (45) Date of Patent: Oct. 21, 2008

(54) MR VISUALIZATION OF INTERVENTIONAL DEVICES

(75) Inventor: Holger Eggers, Kaltenkirchen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 298 days.

(21) Appl. No.: 10/544,354

(22) PCT Filed: Jan. 30, 2004

(86) PCT No.: PCT/IB2004/000224

§ 371 (c)(1), (2), (4) Date: Aug. 3, 2005

(87) PCT Pub. No.: WO2004/070409

PCT Pub. Date: Aug. 19, 2004

(65) Prior Publication Data

US 2006/0173288 A1    Aug. 3, 2006

(30) Foreign Application Priority Data

Feb. 5, 2003  (EP)  ................................. 03100244

(51) Int. Cl.
*A61B 5/05*  (2006.01)
(52) U.S. Cl. ........................ 600/410; 600/424; 600/433; 324/309
(58) Field of Classification Search ................ 600/411, 600/422, 433, 434, 410, 424; 324/309
See application file for complete search history.

(56) References Cited

U.S. PATENT DOCUMENTS 4,572,198 A    2/1986  Codrington (Continued)

FOREIGN PATENT DOCUMENTS

WO    WO 01/75465 A1    10/2001

(Continued)

OTHER PUBLICATIONS

Eggers, H., et al.; Real-Time Incremental Difference Reconstruction for Visualization and Tracking of Switchable Catheters; 2001: Proc. Intl. Soc. Mag. Reson. Med. 9; 2162.

(Continued)

*Primary Examiner*—Eric F Winakur
*Assistant Examiner*—Katherine L Fernandez

(57)  ABSTRACT

MR method for generating MR images of an object to be examined located inside an examination volume by means of an MR device and for simultaneously locating an interventional instrument inserted into the examination object, which instrument is equipped with a locating device. For the reconstruction of an MR image (20) MR signals together with device-delivered location signals from the examination volume are then recorded, after which the locating of the instrument takes place by the assessment of the image characteristics conditioned by the location signals. For making it possible to determine the position of the interventional instrument in an extremely rapid way, the invention proposes that the recording of the MR signals be effected by recording successively a plurality of MR partial data records (16, 17, 18) with respective incomplete and preferably non-cartesian sampling of the local frequency spectrum assigned to the examination volume. Two locating data records (21, 22) each are extracted from each of the MR partial data records (16, 17, 18). The actual locating of the instrument then takes place in that a difference image (33) is reconstructed from the two locating data records (21, 22).

12 Claims, 2 Drawing Sheets

U.S. PATENT DOCUMENTS

| | | | |
|---|---|---|---|
| 5,810,726 A | 9/1998 | Van Vaals | |
| 6,236,205 B1 * | 5/2001 | Ludeke et al. | 324/318 |
| 6,806,711 B2 * | 10/2004 | Reykowski | 324/318 |
| 6,813,512 B2 * | 11/2004 | Aldefeld et al. | 600/410 |
| 2002/0010396 A1 * | 1/2002 | Zhu | 600/410 |

FOREIGN PATENT DOCUMENTS

WO     WO 02/074164 A1    9/2002

OTHER PUBLICATIONS

Glowinski, A., et al.; Active Catheter Visualization Using Field-Inhomogeneity Catheters Combined with Radial Data; 1999: Proc. Intl. Soc. Mag. Reson. Med. 9; 1951.

Peters, D.C., et al.; Active Guidewire Tracking with Real-Time Undersampled Projection Reconstruction; 2002; Proc. Intl. Soc. Mag. Reson. Med. 9; 2271.

* cited by examiner

MR VISUALIZATION OF INTERVENTIONAL DEVICES

The invention relates to an MR method for generating MR images of an object to be examined located inside an examination volume by means of an MR device and for simultaneously locating an instrument similarly located inside the examination volume, which instrument is equipped with a locating device, by means of which location signals can be generated in the environment of the instrument, where MR signals together with the location signals from the examination volume are recorded for the reconstruction of an MR image, while the locating device is simultaneously switched to and fro between states of operation, and where the locating of the instrument takes place in that THE image characteristics caused by the switching processes are assessed.

The invention also relates to an MR device for the execution of such a method as well as a computer program for implementing such a method on an MR device.

Methods based on magnetic resonance (MR) have been gaining importance increasingly in recent times in the field of interventional radiology. The advantage that magnetic resonance has over the X-ray diagnostics generally prevalent in this field is that neither the patient nor the doctor carrying out the intervention is burdened with ionizing radiation. The magnetic resonance also has the advantage of a distinctly better soft portion contrast.

An important requirement for the efficient execution of interventions monitored by means of magnetic resonance is that MR images of the examination volume of interest should be generated with a sufficiently high image rate and that it should be possible to determine the position of the instrument used for the intervention inside the examination volume sufficiently quickly and precisely.

An MR method of the type mentioned in the beginning is already known from, for example, U.S. Pat. No. 6,236,205. In the method already known, locating the interventional instrument takes place by means of a locating device positioned on the interventional instrument. This locating device has a coil arrangement and a modulation unit, while it is possible to modulate by means of a modulation unit a high-frequency signal linked to the coil arrangement. While recording MR signals from the examination volume for the purpose of generating an MR image, the signals contain as a location signal a modulated high-frequency signal of the coil arrangement caused by the locating device of the interventional instrument, from which modulated high-frequency signal the position of the instrument can be determined. According to the method already known, sampling of the MR signals during image recording is done with a sampling frequency double that of the frequency with which the signal radiated by the locating device is modulated. Due to the Cartesian sampling of the local frequency spectrum at the time of the recording of the MR signals, this measure achieves the appearance of the signal generated in the locating device in an image area in the reconstructed MR image, in which area no image signals of the actual object to be examined appear. It is thus possible to identify the locating device and thereby to determine the position of the interventional instrument.

The disadvantage of the method already known is that the locating of the interventional instrument cannot take place until after a complete set of MR images has been recorded and after an MR image has been constructed from it. The frequency with which the locating takes place according to the method already known thus exactly corresponds to the image rate achieved. The time-dependent resolution that can be achieved in this manner in the locating and tracking of the interventional instrument is not sufficient in many applications. It is particularly disadvantageous that the determination of the position of the interventional instrument according to the method already known is comparatively inaccurate, if the interventional instrument is moved during the image recording.

For these reasons, it is an object of the present invention to provide an MR imaging method which allows considerably accelerated locating of an instrument present inside the examination volume. In so doing, the rate, with which the position of the instrument is determined, should be independent of the rate with which the actual MR images are generated.

Based on an MR method of the kind mentioned in the opening paragraph, this stated object is achieved in that the recording of the MR signals and the location signals takes place by successively recording a plurality of MR partial data records, each with incomplete, non-cartesian sampling of the local frequency spectrum assigned to the examination volume, where locating data records are extracted from each of the MR partial data records, so that each of the locating data records is assigned to one of the various states of operation of the locating device and where the locating of the instrument takes place by reconstructing a difference image from the locating data records.

According to the invention, considerable acceleration compared to the existing state of the art technology is achieved in the locating of the instrument, as the position of the instrument can be derived already by assessing only one MR partial data record. From the MR partial data record, which, according to the invention, comprises possibly only a minimum fraction of the image data required for the actual image reconstruction, locating data records are first extracted for this purpose, where each of the locating data records comprises exclusively MR signals and location signals, which are recorded in one of the states of operation of the locating device. Then a respective image each is reconstructed from each of the locating data records, which has under-sampling artifacts due to the incomplete sampling of the local frequency spectrum. The image signals originating from the object to be examined, including the under-sampling artifacts, are almost completely canceled in the difference image resulting from the subtraction of these images. In essence, difference signals remain, which are determined by the switching sequences of the locating device. These difference signals appear in image areas, which can be assigned to the position of the instrument in a unique manner.

The instrument to be localized may be, as embodied in the invention, an interventional instrument, such as an intravascular catheter or a biopsy needle, or also markers made on the patient, which serve to determine the position and orientation of the patient himself/herself within the examination volume.

To be able to determine the position of the instrument within the examination volume in a unique manner with the help of the difference image, according to the invention, the sampling of the local frequency spectrum (also called k space) must be done effectively in a non-Cartesian manner. In case the sampling is done in a cartesian manner, there are artifacts in the difference image due to the sub-sampling of the k-space, which are called ghosts, which distinctly hamper a clear location. As a rule, additional information concerning the position of the instrument would be necessary for Cartesian sampling to be able to make a clear assignment in the assessment of the image information of the difference image for the purpose of locating of the instrument. Such information can, however, be provided by using several receiving coils in parallel each with a different spatial sensitivity profile for recording the MR signals, so that the position of the instrument can be inferred with the help of the respective amplitudes of the location signals.

In the MR method according to the invention, the MR partial data records can be combined advantageously to a complete MR image data record, from which the final MR image is then reconstructed. In this manner, the MR partial data records recorded in a quick time sequence can be used for quickly and accurately locating the instrument, while then the recorded MR signals are at the same time used for reconstruction of the MR image. Thus the MR method as invented has no negative effect on the speed of overall image generation. According to the invention, only parts of the complete MR image data records are assessed for particularly fast and precise locating.

Suitably, the switching frequency, at which the locating device is switched to and fro between the different states of operation in the MR method according to the invention, is half the value of the sampling frequency at which the MR signals are sampled during the recording of the MR partial data records. In this manner, the locating data records can be extracted from the MR partial data records, by recording data points successively in terms of time, and are assigned alternately to one of the two locating data records. This achieves at the same time that the image signals of the images reconstructed from the locating data records originating from the object to be examined are more or less exactly canceled in the difference image, so that the position of the instrument can be readily determined. It is useful to have the sampling frequency with which the MR signals are recorded match at least twice the size of the examination volume, as the data points contained in the MR partial data records are split half each on the locating data records in the manner described before. The increase in the sampling frequency effects as much as possible a reduction of the sub-sampling artifacts inside the difference image, so that locating accuracy is not noticeably compromised. Care must be taken to see that just an increase in the sampling frequency does not increase the measuring time.

It proves advantageous if the local frequency spectrum is sampled radially or spirally when the MR partial data records according to the invention are recorded. The image artifacts remaining in the difference image due to the sub-sampling of the local frequency spectrum are distributed over large image areas during radial or spiral sampling of the local frequency spectrum—unlike in cartesian sampling—so that no "ghosts" can arise and the position of the instrument can be determined unambiguously without any problem with the help of the difference image in spite of the sub-sampling. The locating of the instrument can be done, for example, by finding pixels in the difference image, whose pixel brightness values exceed a threshold value that can be predetermined. This threshold value should then be greater than the artifacts conditioned by the sub-sampling of the local frequency spectrum in the difference image.

Suitable for executing the method according to the invention is an MR device with a primary field coil for generating a homogeneous static magnetic field in an examination volume, several gradient coils for generating magnetic field gradients in the examination volume, a high-frequency coil for generating high-frequency fields in the examination volume and for recording MR signals from the examination volume, an instrument equipped with a locating device, by means of which device location signals can be generated in the environment of the instrument and with a central control unit for controlling the gradient coils, the high-frequency coil and the locating device, as well as with a reconstruction and display unit for processing and displaying the MR signals.

The method described above can be implemented on such an MR device by means of a suitable program control of the central control unit and/or the reconstruction and display unit.

For example, a resonant circuit made from a micro coil and a capacitor and installed in the device may be considered a locating device, where the resonant circuit can be detuned by a control signal of the central control unit. The location signals of such a locating device are high-frequency signals, which are coupled into the resonant circuit and amplified by the resonant circuit. In a state of operation, the resonant circuit is tuned to the resonance frequency of the MR device, so that the location signals can be recorded together with the MR signals and assessed for locating the instrument. In the other state of operation, the resonant circuit is tuned to a frequency deviating from the resonance frequency of the MR device, so that in this state of operation, no high-frequency location signal is generated by the locating device. The detuning of the resonant circuit on switching over between the two states of operation can be done particularly advantageously by an optical method, as described for example in the above-mentioned U.S. Pat. No. 6,236,205.

Alternatively, the locating device may have an electrical conductor arrangement for generating an inhomogeneous magnetic field in the environment of the instrument. The inhomogeneous magnetic field specifically destroys the coherence of the core magnetization in the environment of the instrument. As location signals are used in this case the MR signals recorded from the environment of the instrument and depending on the state of operation of the locating device.

The method according to the invention can be rendered available to the users of the MR devices in the form of a suitable computer program. The computer program can be stored on suitable data carriers, such as CD ROM or diskette, or can be downloaded from the Internet onto the control unit of an MR device.

The invention will be described in more detail with reference to an example of embodiment shown in the drawing, to which, however, the invention is not restricted. In the drawing.

Figure 1:
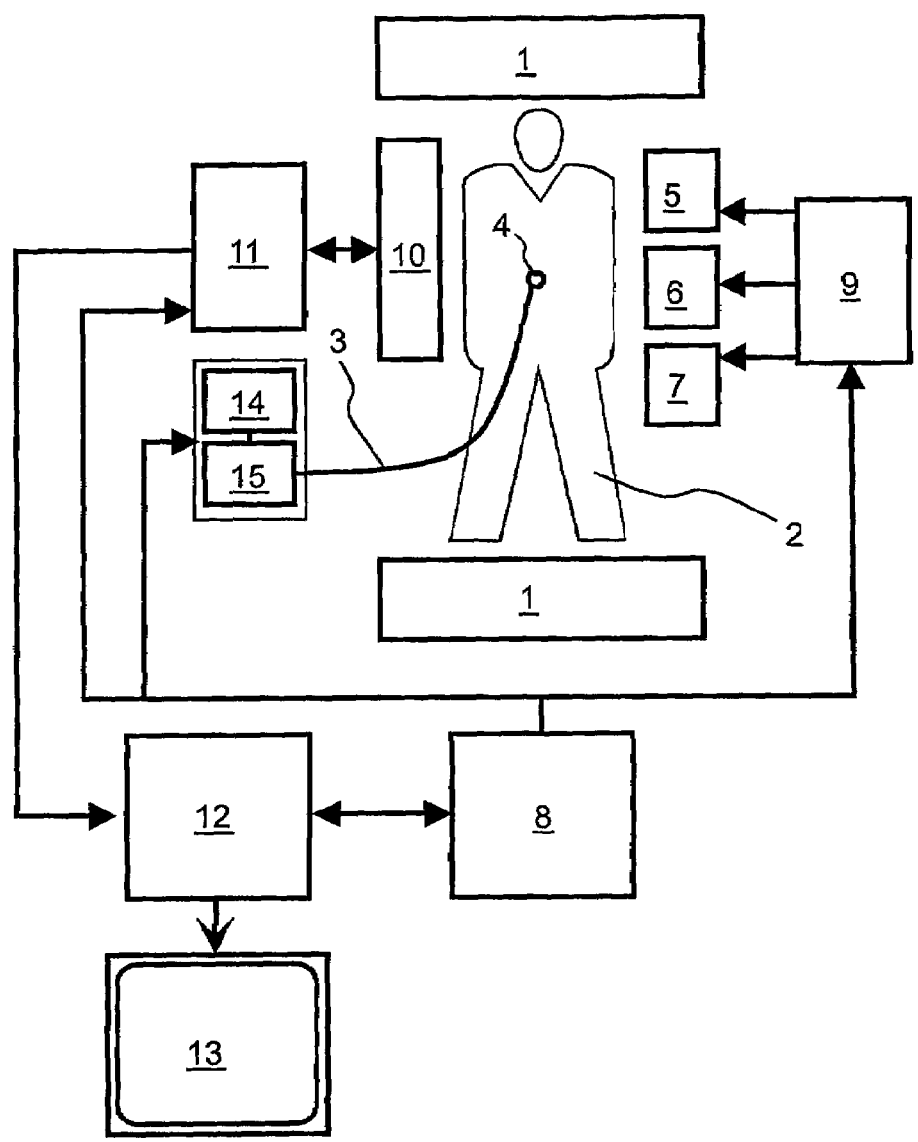
FIG. 1 shows an MR device according to the invention.

FIG. 1 shows an MR device as a block diagram. The device comprises a primary field coil 1 for generating a homogeneous static magnetic field in an examination volume, in which a patient 2 is present. An interventional instrument 3 which may be an intravascular catheter, for example, is inserted into the patient 2. A micro coil which is part of a resonant circuit is provided as locating device 4 in the interventional instrument 3. High-frequency location signals can be generated in the environment of the interventional instrument 3 by means of the micro coil in the manner described above. Furthermore, the MR device has gradient coils 5, 6 and 7 for generation of magnetic field gradients in different spatial directions inside the examination volume. By means of a central control unit 8, which is connected to the gradient coils 5, 6 and 7 through a gradient amplifier 9, the time-dependent path of the magnetic field gradients inside the examination volume is controlled. Furthermore, the MR device shown here also comprises a high-frequency coil 10 for generating high-frequency fields in the examination volume and for recording MR signals from the examination volume. The high-frequency coil 10 is connected with the central control unit 8 or with a reconstruction and display unit 12 via a transceiver unit 11. The MR signals processed by the reconstruction and display unit 12 can be displayed by means of a screen 13. The resonant circuit of the locating device 4 in the MR device shown in the Figure can be detuned by means of an optical signal. The locating device 4 is connected to a light source 14 and a modulator 15 through an optical fiber running in the interventional instrument 3, for modulation of the light from the light source 14. The light source 14 and the modulator 15 are controlled by the central control unit 8, which controls the time-dependent path of the stored light signal and thereby the switching over of the locating device 4 according to the method described above.

The method according to the invention is carried out on the device shown in FIG. 1 by means of a suitable programming of the control unit 8. The reconstruction and display unit 12 is also involved in the reconstruction and assessment of the difference images for the purpose of locating the interventional instrument 3.

Figure 2:
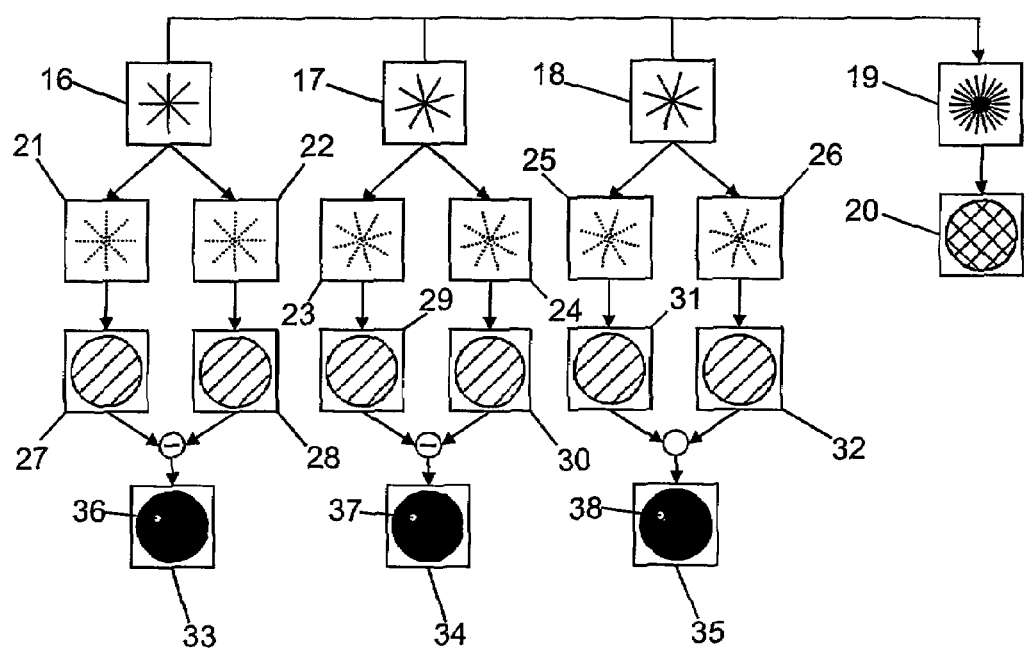
FIG. 2 shows a schematic representation of the MR method according to the invention.

FIG. 2 depicts the processing of the MR signals by the method according to the invention. MR partial data records 16, 17 and 18 are recorded successively in time, each with incomplete, non-Cartesian sampling, it is truss, of the local frequency spectrum assigned to the examination volume. The MR partial data records 16, 17 and 18 are then combined to a complete MR image data record 19, from which an MR image 20 is reconstructed. The star-shaped continuous lines show that the recording of the MR partial data records 16, 17 and 18 is carried out by means of radial sampling of the local frequency spectrum in the depicted application. The sampling takes place each time in different radial directions, such that all in all a complete sampling of local frequency spectrum is available for the MR image data record 19. According to the invention, two locating data records 21, 22 or, as the case may be, 23, 24 or 25, 26 respectively are extracted from each of the MR partial data records 16, 17 and 18. This is done in such a manner that, for example, each of the two locating data records 21 and 22 is assigned to one of the two states of operation of the locating devices, i.e. for example, the MR partial data record 21 contains exclusively MR signals, which are recorded while the resonant circuit of the locating device is tuned to the resonance frequency of the MR device. The MR partial data record 22 accordingly exclusively comprises MR signals, which are recorded with the detuned resonant circuit. This may be achieved in that the switching frequency, with which the locating device is switched to and fro between the two states of operation is half the sampling frequency with which the MR signals are sampled during the recording of the MR partial data records 16, 17 and 18. The locating data records 21 and 22 may then be generated in that every second data point inside the MR partial data record 16 is included in either the locating data record 21 or in the locating data record 22. At the same time, for minimizing the sub-sampling artifacts, the sampling frequency with which the MR signals are recorded during the recording of the MR partial data record 16 should be double the frequency actually required for sampling the local frequency spectrum assigned to the examination volume. This ensures that the locating data records 21 and 22 contain complete data, at any rate as far as the radial sampling direction is concerned. In this manner, sub-sampling artifacts in images reconstructed from the locating data records can be minimized, which has a positive effect on the accuracy and clarity in the locating of the instrument. Individual intermediate images 27, 28 or 29, 30 or 31, 32 are reconstructed from the locating data records 21, 22 and 23, 24 as well as 25, 26. For example, the intermediate images 27 and 28 differ from each other exclusively in the different location signals generated by the locating device in the two different states of operation. The radial direction of the sampling of the local frequency spectrum inside the two MR partial data records 21 and 22 is in essence identical, as can be seen from the dotted lines arranged in a star shape in FIG. 2. This results in that the two intermediate images 27 and 28 have in a more or less identical manner certain image artifacts caused by the incomplete radial sampling of the local frequency spectrum. The difference images 33 or 34 or 35 are then calculated from the intermediate images 27, 28; 29, 30 and 31, 32. Image signals contained in the respective intermediate images are canceled in the difference images 33, 34 and 35, where the image intensity is retained exclusively in the image areas 36, 37 and 38. This image intensity can be attributed to different location signals in the two states of operation of the locating device, such that the position of the interventional instrument can be determined from it.

It is clear from the FIG. 2 that the locating of the interventional instrument can be done several times—thrice, in the application shown—during the recording of a complete MR image 20. For this purpose, the MR partial data records 16, 17 and 18 are used, from which at the same time the complete MR image data records 19 is composed for the MR image 20.

The invention has been described with reference to the preferred embodiments, Modifications and alterations may occur to others upon reading and understanding the preceding detailed description. II is intended that the invention be constructed as including all such modifications and alterations insofar as they come within the scope of the appended claims or the equivalents thereof.

The invention claimed is:

1. An MR method for generating MR images of an object to be examined located inside an examination volume by means of an MR device and for simultaneously locating an instrument also located inside the examination volume, wherein the instrument is equipped with a locating device, by which location signals can be generated in the environment of the instrument, where MR signals together with the location signals from the examination volume are recorded for the reconstruction of an MR image, while the locating device is simultaneously switched to and fro between various states of operation, and wherein the locating of the instrument takes place in that the image characteristics, caused by the switching processes are analyzed, wherein the recording of the MR signals takes place by successively recording at least first and second incompletely sampled partial data records with incomplete sampling of the local frequency spectrum assigned to the examination volume, each incompletely sampled partial data record including a first locating data subrecord and a second locating data subrecord, where the first and second locating data subrecords are extracted from each of the MR incompletely sampled partial data records, so that each of the locating data subrecords is assigned to one of the states of operation of the locating device and where the locating of the instrument takes place by reconstructing difference images from the first and second locating data subrecords of each of the at least first and second incompletely sampled partial data records wherein by combining the at least first and second incompletely sampled partial data records, a complete MR image data record is generated from which the MR image is reconstructed, such that at least two difference images are generated for each MR image.

2. The MR method as claimed in claim 1, wherein the sampling of the local frequency spectrum takes place during the recording of the MR signals in a non-cartesian way.

3. The MR method as claimed in claim 2, wherein the local frequency spectrum is sampled radially or spirally at the time of the recording of the MR partial data records.

4. The MR method as claimed in claim 1, wherein the switching frequency, with which the locating device is switched to and fro between the various states of operation, is half a sampling frequency with which the MR signals are sampled during the recording of the MR partial data records.

5. The MR method as claimed in claim 1, wherein locating the instrument is carried out by finding out pixels in the difference image, the brilliance values of which pixels exceeding a threshold value that can be predefined.

6. A computer useable medium having a program code means embodied therein for controlling a processor of an MR device to perform the method as claimed in claim 1.

7. A magnetic resonance imaging system for imaging an object and an instrument located within the object, said system comprising:
  an MR imaging device that produces MR signals based on a sampling frequency;
  a locating device coupled to the instrument, wherein the locating device has a switching frequency that is approximately half of the sampling frequency of the MR imaging device; and
  a controller that:
    generates a plurality of incompletely sampled data records, each of which includes a first locating data subrecord which includes data collected while the locating device is in a first state and a second locating data subrecord which includes data collected while the locating device is in a second state;
    reconstructs the first locating data subrecord of each incompletely sampled data record into a first artifacted intermediate image;
    reconstructs the second locating data subrecord of each incompletely sampled data record into a second artifacted intermediate image, the first and second artifacted intermediate images being analogously artifacted;
    subtracts the first and second artifacted intermediate images of each incompletely sampled data record to generate a difference image with an intensity differentiated image area denoting a location of the locating device at a first time;
    combines the plurality of incompletely sampled data records to form a complete data record; and
    reconstructs the complete data record into a diagnostic image such that a plurality of difference images denoting the location of the locating device are generated for each complete diagnostic image generated.

8. An MR method for generating MR images of an examination volume in which an instrument with a locating device is located, the method comprising:
  generating a first incompletely sampled data record, which includes a first locating data subrecord which includes data collected while the locating device is in a first state and a second locating data subrecord which includes data collected while the locating device is in a second state;
  reconstructing the first locating data subrecord of the first incompletely sampled data record into a first artifacted intermediate image;
  reconstructing the second locating data subrecord of the first incompletely sampled data record into a second artifacted intermediate image, the first and second artifacted intermediate images being analogously artifacted;
  subtracting the first and second artifacted intermediate images of the first incompletely sampled data record to generate a first difference image with an intensity differentiated image area denoting a location of the locating device at a first time;
  generating a second incompletely sampled data record, which includes a first locating data subrecord which includes data collected while the locating device is in a first state and a second locating data subrecord which includes data collected while the locating device is in a second state;
  reconstructing the first locating data subrecord of the second incompletely sampled data record into a first artifacted intermediate image;
  reconstructing the second locating data subrecord of the second incompletely sampled data record into a second artifacted intermediate image, the first and second artifacted intermediate images being analogously artifacted;
  subtracting the first and second artifacted intermediate images of the second incompletely sampled data record to generate a second difference image with an intensity differentiated image area denoting a location of the locating device at a second time;
  combining the first and second incompletely sampled data records to form a complete data record;
  reconstructing the complete data record into a diagnostic image such that two difference images denoting the location of the locating device are generated for each diagnostic image generated.

9. The MR method as claimed in claim 8, further including:
  generating a third incompletely sampled data record, which includes a first locating data subrecord which includes data collected while the locating device is in a first state and a second locating data subrecord which includes data collected while the locating device is in a second state;
  reconstructing the first locating data subrecord of the third incompletely sampled data record into a first artifacted intermediate image;
  reconstructing the second locating data subrecord of the third incompletely sampled data record into a second artifacted intermediate image, the first and second artifacted intermediate images being analogously artifacted;
  subtracting the first and second artifacted intermediate images of the third incompletely sampled data record to generate a third difference image with an intensity differentiated image area denoting a location of the locating device at a third time;
  combining the first, second, and third incompletely sampled data records to form the complete data record, such that three difference images denoting the location of the locating device are generated for each diagnostic image.

10. A computer useable medium having a program code means embodied therein for controlling a processor of an MR device to perform the method as claimed in claim 8.

11. A magnetic resonance imaging device for generating MR images of an examination volume in which an instrument with a locating device is located, the apparatus comprising:
  means for generating a plurality of incompletely sampled data records, each of the incompletely sampled data records including a first locating data subrecord which includes data collected while the locating device is in a first state and a second locating data subrecord which includes data collected while the locating device is in a second state;

means for reconstructing the first locating data subrecord of each incompletely sampled data record into a first artifacted intermediate image and reconstructing the second locating data subrecord of each incompletely sampled data record into a second artifacted intermediate image, the first and second artifacted intermediate images being analogously artifacted;

means for subtracting the first and second artifacted intermediate images of each incompletely sampled data record to generate a difference image with an intensity differentiated image area denoting a location of the locating device at a first time;

means for combining the plurality of incompletely sampled data records to form a complete data record;

means for reconstructing the complete data record into a diagnostic image such that a plurality of difference images denoting the location of the locating device are generated for each diagnostic image generated.

12. The magnetic resonance imaging device as claimed in claim 11, wherein the locating device has a switching frequency that is approximately half of a sampling frequency of MR signals.

* * * * *